(12) United States Patent
Bower et al.

(10) Patent No.: US 11,742,450 B2
(45) Date of Patent: Aug. 29, 2023

(54) HYBRID ELECTRO-OPTICALLY CONTROLLED MATRIX-ADDRESSED SYSTEMS

(71) Applicant: X Display Company Technology Limited, Dublin (IE)

(72) Inventors: Christopher Andrew Bower, Raleigh, NC (US); Matthew Alexander Meitl, Durham, NC (US); Robert R. Rotzoll, Colorado Springs, CO (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 83 days.

(21) Appl. No.: 17/008,264

(22) Filed: Aug. 31, 2020

(65) Prior Publication Data

US 2022/0069154 A1    Mar. 3, 2022

(51) Int. Cl.
*H01L 31/173*    (2006.01)
*H01L 31/02*    (2006.01)
*H01L 31/153*    (2006.01)
*H01L 31/0232*    (2014.01)
*G02B 6/10*    (2006.01)

(52) U.S. Cl.
CPC .............. *H01L 31/173* (2013.01); *G02B 6/10* (2013.01); *H01L 31/02019* (2013.01); *H01L 31/02327* (2013.01); *H01L 31/153* (2013.01)

(58) Field of Classification Search
CPC ............. H01L 31/173; H01L 31/02019; H01L 31/02327; H01L 31/153; G02B 6/10
USPC ........................................................ 257/85
See application file for complete search history.

(56) References Cited

U.S. PATENT DOCUMENTS

| 6,854,030 | B2 | 2/2005 | Perino et al. |
| 7,622,367 | B1 | 11/2009 | Nuzzo et al. |
| 7,943,491 | B2 | 5/2011 | Nuzzo et al. |
| 8,506,867 | B2 | 8/2013 | Menard |
| 8,722,458 | B2 | 5/2014 | Rogers et al. |
| 8,889,485 | B2 | 11/2014 | Bower |
| 10,103,069 | B2 | 10/2018 | Bower et al. |

(Continued)

OTHER PUBLICATIONS

Cok, R.S. et al., Inorganic light-emitting diode displays using micro-transfer printing, J. Soc. Inf. Disp., 25(10):589-609 (2017).

*Primary Examiner* — Calvin Y Choi
(74) *Attorney, Agent, or Firm* — Choate, Hall & Stewart LLP; Michael D. Schmitt

(57) ABSTRACT

An electro-optically controlled active-matrix system comprises a system substrate, row wires extending in a row direction disposed on the system substrate, a row controller providing a row electrical signal to each row wire, column light-pipes extending in a column direction disposed on the system substrate, a column controller providing a column optical signal to each column light-pipe, and pixels disposed over the system substrate. Each pixel can comprise a pixel circuit that is uniquely responsive to a row wire and to a column light-pipe, the pixel circuit receiving the row electrical signal from the row wire and receiving the column optical signal from the column light-pipe. In some embodiments, column wires carrying column electrical signals extend in a column direction over the system substrate and the pixel circuit is capacitively coupled to the row wire, the column wire, or both.

9 Claims, 9 Drawing Sheets

(56) References Cited

U.S. PATENT DOCUMENTS

| | | |
|---|---|---|
| 10,153,256 B2 | 12/2018 | Cok et al. |
| 10,224,460 B2 | 3/2019 | Bower et al. |
| 10,361,180 B2 | 7/2019 | Rogers et al. |
| 10,468,363 B2 | 11/2019 | Prevatte et al. |
| 10,714,374 B1 | 7/2020 | Cok et al. |
| 2003/0048261 A1* | 3/2003 | Yamamoto ............ G06F 3/0446 |
| | | 345/173 |
| 2016/0055801 A1* | 2/2016 | Kim ........................ G09G 3/34 |
| | | 345/208 |
| 2016/0093600 A1 | 3/2016 | Bower et al. |
| 2018/0191978 A1* | 7/2018 | Cok ..................... G09G 3/3208 |

* cited by examiner

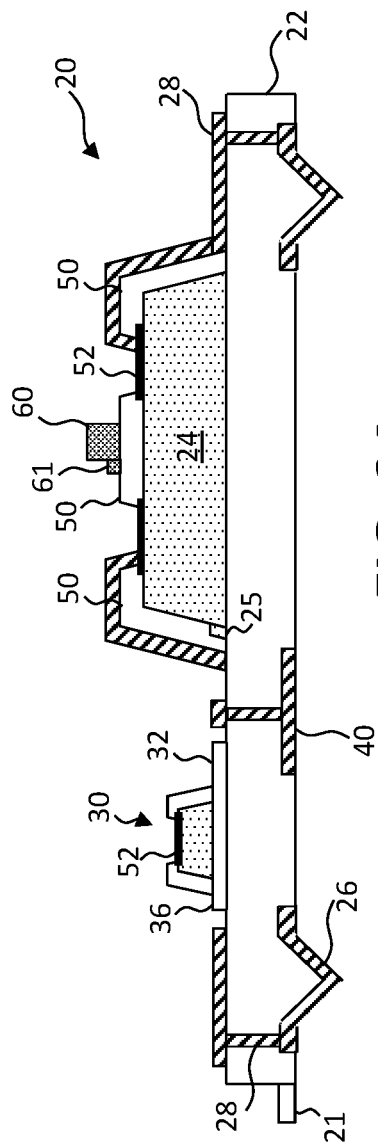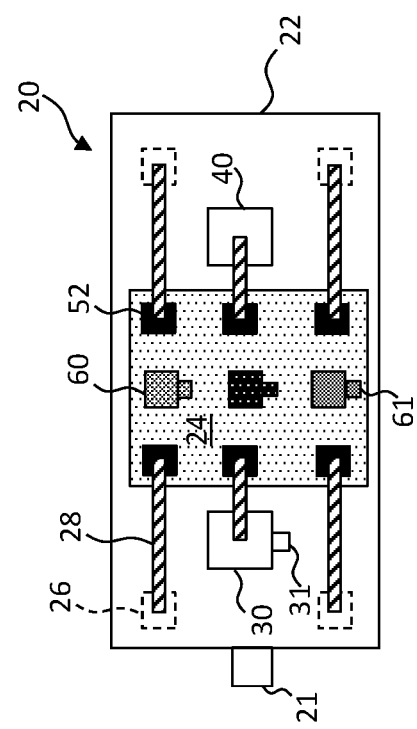
FIG. 3A
FIG. 3B

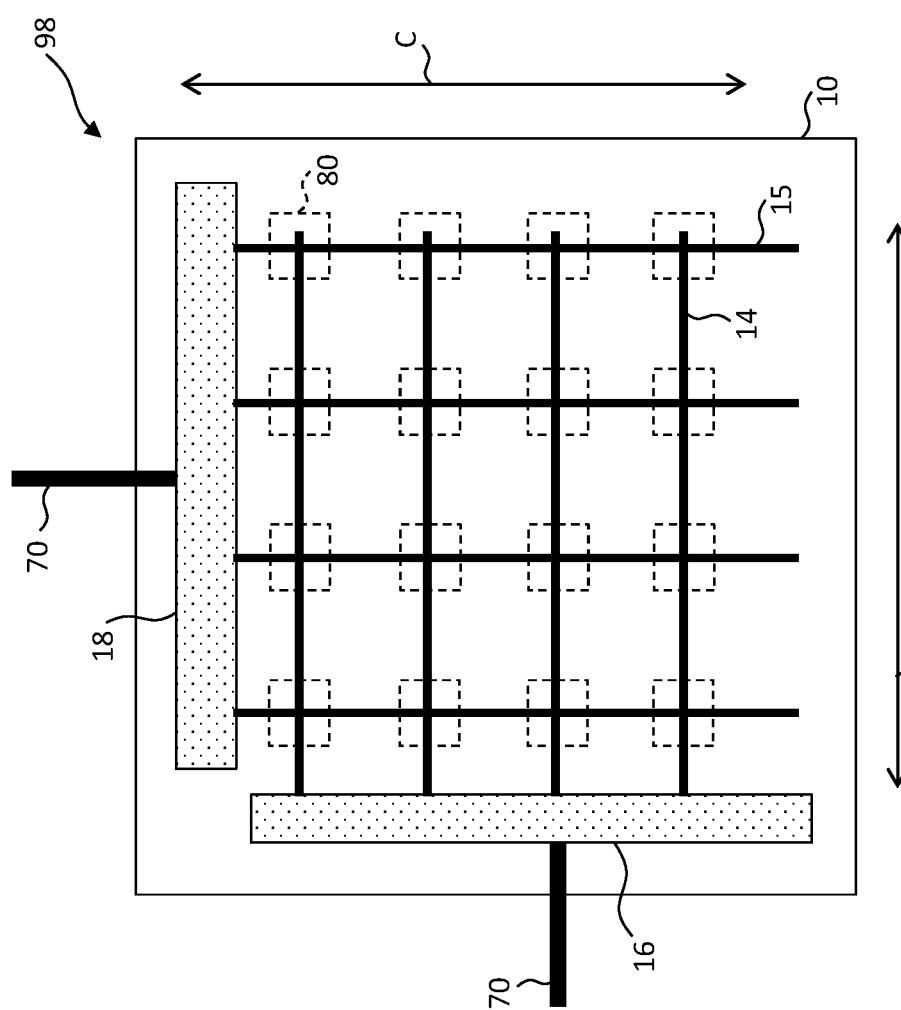

HYBRID ELECTRO-OPTICALLY CONTROLLED MATRIX-ADDRESSED SYSTEMS

TECHNICAL FIELD

The present disclosure relates generally to structures and methods for controlling an active-matrix system (such as a display) using both electrical and optical control signals or, in some embodiments, capacitive elements.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating a thin layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Methods for transferring active small components from one substrate to another are described in U.S. Pat. No. 7,943,491. In examples of these approaches, small integrated circuits are formed on a native semiconductor source wafer. The small unpackaged integrated circuits, or chiplets, are released from the native source wafer by etching a layer formed beneath the circuits. A PDMS stamp is pressed against the native source wafer and the process side of the chiplets is adhered to individual stamp posts. The chiplets are removed from the native source wafer and pressed against a destination substrate or backplane with the stamp to adhere the chiplets to the destination substrate. In other examples, U.S. Pat. No. 8,722,458 teaches transferring light-emitting, light-sensing, or light-collecting semiconductor elements from a wafer substrate to a destination substrate or backplane.

Active-matrix control structures and methods are often used to control arrays of functional devices (such as pixels) disposed on a substrate (such as a display substrate). The functional devices are typically arranged in rows and columns. Each row of functional devices is electrically connected to a row wire and each column of functional devices is electrically connected to a column wire, so that each functional device is uniquely connected to each combination of a row wire and a column wire. Electrical signal communication can be through capacitive coupling, for example as disclosed in U.S. Pat. No. 6,854,030. However, signals provided on row and column wires that extend over large substrates can degrade as they propagate across the large substrate due to the resistance of the wires, propagation delays, and parasitic capacitance that can significantly limit control signal frequencies. Moreover, power and ground signals can have different values at different locations on the substrate due to resistance in power and ground wires or conductive planes. There is a need, therefore, for improved active-matrix system architectures.

SUMMARY

The present disclosure provides, inter alia, architectures, structures, materials, and methods for improved active-matrix control of, and electrical connection to, functional devices over a substrate. In accordance with certain embodiments of the present disclosure, an electro-optically controlled active-matrix system comprises a system substrate, row wires extending in a row direction disposed on or in the system substrate, a row controller operable to provide a respective row electrical signal to each of the row wires, column light-pipes extending in a column direction disposed on the system substrate, a column controller operable to provide a respective column optical signal to each of the column light-pipes, and pixels disposed over the system substrate. Each of the pixels can comprise a pixel circuit that is uniquely responsive to one of the row wires and to one of the column light-pipes, the pixel circuit operable to receive the respective row electrical signal from the row wire and operable to receive the respective column optical signal from the one of the column light-pipes. According to some embodiments, the electro-optically controlled active-matrix system is a display system or an imaging system.

In some embodiments, the pixels are arranged in a matrix-addressed array over the system substrate and the row wires can be substantially orthogonal to the column light-pipes, for example within the limits of a manufacturing process.

The column controller can comprise an inorganic light-emitting diode that emits light into each of the column light-pipes. The pixel circuit can comprise an optical input circuit responsive to the respective column optical signal and an electrical input circuit responsive to the respective row electrical signal, wherein the optical input circuit comprises a light sensor. The electrical input circuit of the pixel circuit can be capacitively coupled to the one of the row wires corresponding to the pixel circuit. Each of the pixels can comprise an inorganic light-emitting diode, a light sensor (e.g., a photosensor), or both.

According to embodiments of the present disclosure, each of the pixels comprises a pixel substrate non-native to (e.g., separate and independent from) and disposed on or over the system substrate and a pixel circuit operable to respond to (e.g., responsive to) a row electrical signal and responsive to a column optical signal, the pixel circuit disposed on, in, or over the pixel substrate. The pixel can comprise an inorganic light-emitting diode electrically connected to the pixel circuit or a photosensor electrically connected to the pixel circuit. The inorganic light-emitting diode and the photosensor can comprise fractured tethers as a consequence of micro-transfer printing the inorganic light-emitting diode or photosensor from corresponding native source wafers onto the pixel substrate or pixel circuit. The pixel or pixel substrate can comprise a fractured or separated tether as a consequence of micro-transfer printing the pixel from a pixel source wafer onto the system substrate. An electrical sensing plate (e.g., a capacitor plate) can be electrically connected to the pixel circuit or the pixel circuit can comprise an electrical sensing plate. The pixel substrate can comprise a dielectric structure having a top side and a bottom side, the pixel circuit can be disposed on the top side, and the electrical sensing plate can be disposed on the bottom side. The pixel substrate can comprise a semiconductor or compound semiconductor.

According to some embodiments of the present disclosure, connection posts can extend from the pixel substrate, the connection posts electrically connected to the pixel circuit. According to some embodiments, the pixel substrate comprises a dielectric structure having a top side and a bottom side, the pixel circuit is disposed on the top side, and the connection posts extend from the bottom side.

The pixel can be a heterogeneously integrated device comprising a semiconductor device and a compound semiconductor device, wherein the semiconductor device comprises a semiconductor and the compound semiconductor device comprises a compound semiconductor different from the semiconductor.

According to embodiments of the present disclosure, a capacitively coupled active-matrix system comprises a system substrate, row wires extending in a row direction over the system substrate, a row controller operable to provide a row electrical signal to each of the row wires disposed on the system substrate, column wires extending in a column direction over the system substrate, a column controller operable to provide a column electrical signal to each of the column wires disposed on the system substrate, and pixels disposed over the system substrate. Each of the pixels comprises a pixel circuit that is uniquely responsive to one of the row wires and to one of the column wires, the pixel circuit operable to receive the row electrical signal from the one of the row wires and operable to receive the column electrical signals from the one of the column wires. The pixel circuit is capacitively coupled to the one of the row wires and is capacitively coupled to the one of the column wires. The electro-optically controlled active-matrix system can be a display system or an imaging system.

In some embodiments, the pixels are arranged in a matrix-addressed array over the system substrate and the row wires can be substantially orthogonal to the column wires.

According to embodiments of the present disclosure, the column controller comprises an electrical circuit that provides a column electrical signal on each of the column wires. The pixel circuit can comprise an electrical input circuit responsive to the column electrical signal from the one of the column wires. The electrical input circuit of the each of the pixels can be capacitively coupled to the one of the row wires corresponding to the pixel, can be capacitively coupled to the one of the column wires corresponding to the pixel, or can be capacitively coupled to both the one of the row wires and the one of the column wires corresponding to the pixel.

According to some embodiments, each of the pixels comprises one or more inorganic light-emitting diodes. The inorganic light-emitting diode can comprise a fractured tether as a consequence of micro-transfer printing the inorganic light-emitting diode from a native source wafer onto the pixel substrate or pixel circuit. Each of the pixels can comprise a capacitive sensor. Each of the pixels can comprise a pixel substrate separate and independent from the system substrate. The pixel substrate can comprise a fractured or separated tether, for example as a consequence of micro-transfer printing the pixel or pixel substrate from a pixel source wafer to the system substrate. The pixel substrate can comprise a semiconductor.

According to some embodiments, for each of the pixels, the one of the row lines and the one of the column lines cross over on the system substrate at a cross-over location, the pixel comprises a pixel edge, and the cross-over location is closer to the pixel edge than to a center of the pixel.

According to embodiments of the present disclosure, a pixel comprises a pixel substrate and a pixel circuit responsive to a row electrical signal and a column electrical signal. The pixel circuit can be disposed on, in, or over the pixel substrate, the pixel circuit can be capacitively coupled to the row electrical signal, can be capacitively coupled to the column electrical signal, or can be capacitively coupled to both the row electrical signal and the column electrical signal. In some embodiments, the pixel comprises one or more electrical sensing plates, wherein the pixel circuit is operable to receive at least one of the row electrical signal by capacitive coupling through at least one of the one or more electrical sensing plates and the column electrical signal by capacitive coupling through at least one of the one or more electrical sensing plates.

The pixel can comprise an inorganic light-emitting diode electrically connected to the pixel circuit, a light sensor (e.g., a photosensor) electrically connected to the pixel circuit, or both. The inorganic light-emitting diode can comprise a fractured tether as a consequence of micro-transfer printing the inorganic light-emitting diode from a native source wafer onto the pixel substrate or pixel circuit. The pixel or pixel substrate can comprise a fractured or separated tether as a consequence of micro-transfer printing the pixel or pixel substrate from a pixel source wafer to the system substrate. The pixel can comprise an electrical sensing plate electrically connected to the pixel circuit. The pixel or the pixel substrate can comprise a dielectric structure having a top side and a bottom side, the pixel circuit can be disposed on the top side, and the one or more electrical sensing plates can be or are disposed on the bottom side.

According to some embodiments, a pixel comprises connection posts extending from the pixel substrate wherein the connection posts are electrically connected to the pixel circuit. According to some embodiments, the pixel substrate comprises a dielectric structure having a top side and a bottom side, the pixel circuit is disposed on the top side, and the connection posts extend from the bottom side.

The pixel can be a heterogeneously integrated device comprising a semiconductor device and a compound semiconductor device, wherein the semiconductor device comprises a semiconductor and the compound semiconductor device comprises a compound semiconductor different from the semiconductor.

According to embodiments of the present disclosure, the pixel comprises a pixel edge and a pixel center and the electrical input circuit is capacitively coupled to the row wire closer to the pixel edge than to the pixel center or the electrical input circuit is capacitively coupled to the column wire closer to the pixel edge than to a center of the pixel.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 3A is a schematic cross section of a pixel according to illustrative embodiments of the present disclosure;

FIG. 3B is a schematic plan view of a pixel according to illustrative embodiments of the present disclosure;

FIG. 5 is a schematic plan view of a capacitively coupled active-matrix system comprising pixels disposed on a system substrate according to illustrative embodiments of the present disclosure;

Figure 1:
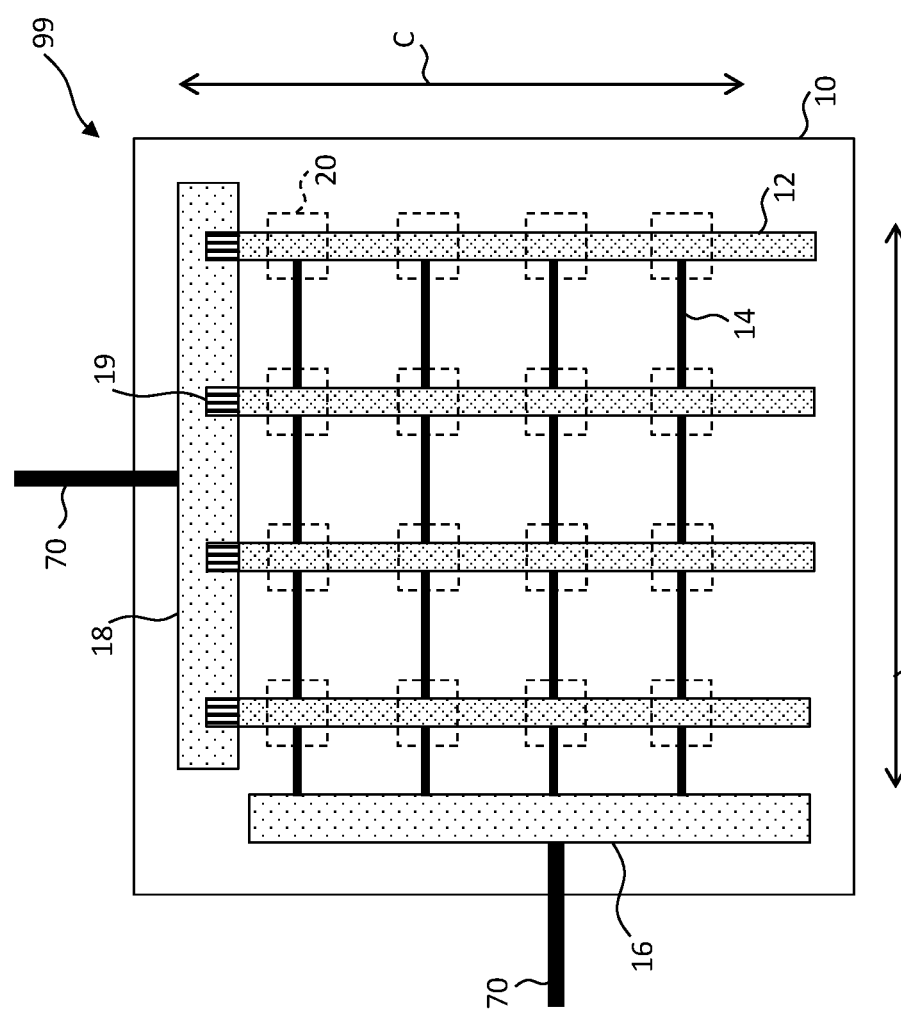
FIG. 1 is a schematic plan view of an electro-optically controlled active-matrix system comprising pixels disposed on a system substrate according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Electrical power and signal distribution over large substrates, for example display or imaging substrates, can suffer from resistive losses and parasitic capacitance that reduces the voltage over the substrate and the frequency at which control signals can propagate over the substrate. For example, power and ground signals can have different values at different locations on the substrate and resistive losses, parasitic capacitance, and propagation delays can significantly limit control signal frequencies. There is a need, therefore, for improved active-matrix system architectures. Certain embodiments of the present disclosure are directed toward architectures, structures, materials, and methods for improved active-matrix control at increased frequencies of functional devices disposed in arrays over a system substrate. In some embodiments of the present disclosure, the functional devices are pixels in a display and the system substrate can be a display substrate. In some embodiments of the present disclosure, the functional devices are sensors in a detector (e.g., an imaging system) and the system substrate can be an imaging substrate. Each functional device can be a picture element, or pixel, that either emits electromagnetic radiation (such as visible radiation in a display) or absorbs electromagnetic radiation (such as scintillation in an imaging system). Embodiments of the present disclosure provide control methods and devices that increase the frequency at which pixels can operate and reduce the operational sensitivity of the pixels to variations in supply voltages and ground signals.

Figure 2B:
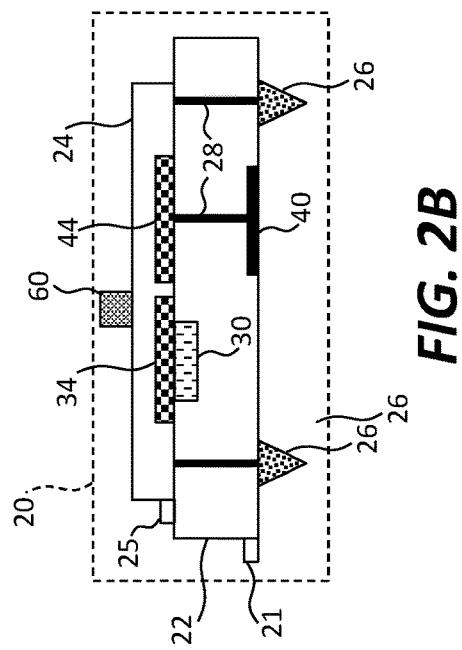
FIG. 2B is an illustrative cross section of the pixel of FIG. 2A.
Figure 2C:
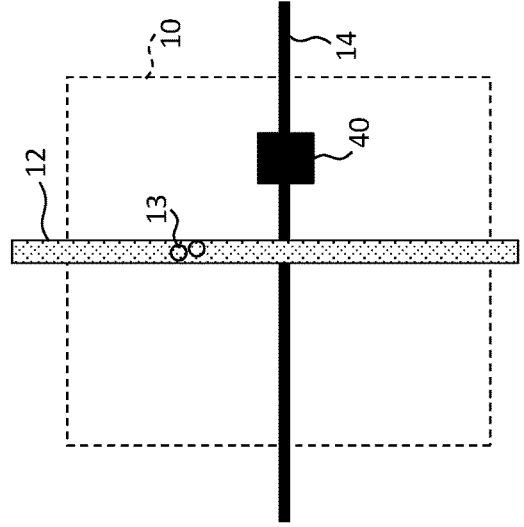
FIG. 2C is a partial schematic plan view of the system substrate of FIG. 2A according to illustrative embodiments of the present disclosure.
Figure 2A:
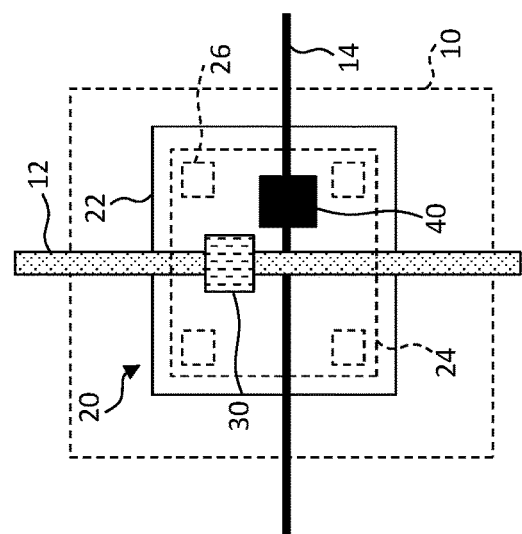
FIG. 2A is a schematic plan view of a pixel disposed on a system substrate.

According to some embodiments of the present disclosure and with reference to FIG. 1 and the details of FIGS. 2A, 2B, and 2C, an electro-optically controlled active-matrix system 99 comprises a system substrate 10, row wires 14 extending in a row direction R over system substrate 10, and column light-pipes 12 extending in a column direction C over system substrate 10. A row controller 16 provides a row electrical signal to each row wire 14 and a column controller 18 provides a column optical signal to each column light-pipe 12. Pixels 20 are disposed over system substrate 10, for example in a regular array. Each pixel 20 comprises a pixel circuit 24 that is uniquely responsive to a row wire 14 and to a column light-pipe 12. Pixel circuit 24 receives the row electrical signal from row wire 14 and receives the column optical signal from column light-pipe 12.

In some embodiments, pixels 20 can comprise one or more light-emitters controlled by pixel circuit 24, for example inorganic light-emitting diodes, and electro-optically controlled active-matrix system 99 can be a display (for example, as shown in FIG. 2B). In some embodiments, pixels 20 comprise one or more light sensors 30 (e.g., photosensors 30) controlled by pixel circuit 24, for example photo-diodes or photo-transistors sensitive to electromagnetic radiation and electro-optically controlled active-matrix system 99 can be an imaging system (e.g., in an embodiment analogous to FIG. 1). Light sensors 30 or photosensors 30 can be responsive to visible light, infrared light, or ultraviolet light, or other suitable frequencies of electromagnetic radiation. Pixels 20 can be arranged in an array over or on system substrate 10, for example a two-dimensional array, and column direction C can be orthogonal to row direction R over system substrate 10 so that row wires 14 are substantially orthogonal to column light-pipes 12 (e.g., to within 5 degrees or to within the limitations of a manufacturing process).

In some embodiments, pixels 20 can be formed on or in system substrate 10, for example comprising thin-film circuits formed in a semiconductor thin-film layer constructed using photolithographic methods, such as those found in the display industry. In some embodiments, pixels 20 can comprise a pixel substrate 22, for example a silicon substrate, on or in which pixel circuit 24 is disposed, for example an integrated circuit formed by using photolithographic methods and materials. Pixels 20, for example including pixel substrate 22 can be disposed on system substrate 10, for example by micro-transfer printing pixels 20 from a pixel source wafer to system substrate 10.

System substrate 10 can be any suitable substrate, for example having a relatively planar surface on which pixels 20, row wires 14, and column light-pipes 12 can be disposed, for example glass, polymer, sapphire, quartz, metal, ceramic, or substrates found in the display or imaging industries can be used. Row wires 14 can be metal traces disposed on system substrate 10 by evaporation or sputtering and patterned using photolithographic methods and materials, for example mask-exposed photo-resist, etching, and rinsing. Column light-pipes 12 can comprise patterned and shaped dielectric materials (e.g., silicon dioxide or polymers such as polyimide, resins, or epoxies such as SU-8) that are substantially transparent (e.g., no less than 50% transparent to a frequency of electromagnetic radiation (e.g., light) transmitted through column light-pipes 12 or higher) and can be formed using photolithographic methods and materials used in the photonics and silicon photonics industries, or by inkjet deposition or micro-molding methods. Column light-pipes 12 can transmit light using total internal reflection or can comprise reflective coatings, such as metal coatings evaporatively deposited and patterned using photolithography.

Row controller 16 and column controller 18 can be separate integrated circuits formed in or disposed on system substrate 10, for example using surface-mount technology. Row controller 16 and column controller 18 can each comprise multiple different circuits, for example different integrated circuits that, together, form corresponding row controller 16 or column controller 18. The different integrated circuits can be unpackaged dies deposited on system substrate 10, for example by micro-transfer printing. Row controller 16 and column controller 18 can each be electrically controlled through an electrical bus 70, for example from a controller (not shown in the Figures).

Row controller 16 can comprise an electrical circuit that can provide row electrical signals on row wires 14 to control pixels 20. Column controller 18 can provide column electrical signals that energize column light emitters 19 (for example inorganic light-emitting diodes (iLEDs 60) or diode lasers (e.g., LED lasers)) that emit light into each column light-pipe 12. Column light emitters 19 convert the column electrical signals into column optical signals (e.g., light or optical pulses) that are emitted into column light-pipes 12, for example using structure and methods known in the optical and photonics industries. The row electrical signals propagate along row wires 14 and are received by pixel 20, for example by pixel circuit 24. The column optical signals travel through column light-pipes 12 and are received by pixel 20, for example by a light sensor 30, (e.g., a photosensor) that converts the column optical signals into column electrical signals that are used by pixel circuit 24 to control pixel 20 (e.g., iLEDs 60). In some embodiments, row electrical signals are row-select signals that select a row of pixels 20 and column optical signals are column-data signals that provide data to a column of pixels 20. Row-select signals can operate at a lower frequency than the column optical signals. Because, in certain embodiments, the higher-frequency signals are optical rather than electrical, problems with power and ground distribution and signal integrity over system substrate 10 are reduced or eliminated.

Pixel circuit 24 can comprise an optical input circuit 34 responsive to the column optical signal that comprises light sensor 30 (e.g., a photosensor, photodiode, or phototransistor) and an electrical input circuit 44 responsive to the row electrical signal. Optical input circuit 34 receives the column-data information and electrical input circuit 44 receives the row-select signal and optical input circuit 34 and electrical input circuit 44 together produce electrical responses used by pixel circuit 24 to perform the function of pixel circuit 24.

According to some embodiments of the present disclosure, electrical input circuit 44 of pixel 20 is capacitively coupled to row wire 14 corresponding to pixel 20. A capacitively coupled interface does not require a physical electrical signal connected between two electrical elements but rather relies on an electrical field provided on one capacitor plate 40 and sensed by another capacitor plate 40 (electrical sensor pad), in this case a capacitor plate 40 disposed on or over system substrate 10 and another capacitor plate 40 disposed on either the top or bottom (as shown in FIG. 2B) of pixel substrate 22. Capacitor plate 40 can be electrically connected to electrical input circuit 44 using pixel wires 28 and, in some embodiments where a capacitor plate is disposed on the bottom of pixel substrate 22, with through-silicon vias. In some embodiments in which pixel 20 is provided on a pixel substrate 22 separate and independent of system substrate 10, such capacitive coupling can reduce the number of electrical connections required between pixel substrate 22 and system substrate 10. Likewise, the use of an optical interface between column light-pipes 12 on system substrate 10 and light sensor 30 on pixel substrate 22 also reduces the number of electrical connections required between pixel substrate 22 and system substrate 10. Capacitor plates 40 can comprise a portion of row wire 14 or can be a conductive area on system substrate 10 (or pixel substrate 22) similar to a planar contact pad electrically connected to row wire 14 that has a larger extent over system substrate 10 than row wire 14, for example as shown in FIG. 2C. A greater extent can increase the capacitive coupling area and improve signal response to row electrical signals by electrical input circuit 44.

According to some embodiments of the present disclosure, column light-pipes 12 can comprise an optical structure 13, such as a light diffuser or light reflector that redirects at least a portion of column optical signals from column light-pipes 12 to light sensor 30 in pixel 20. This can increase the optical response of column light-pipes 12 to improve the quality and signal-to-noise ratio of column optical signals as received by optical input circuit 34.

Figure 4:
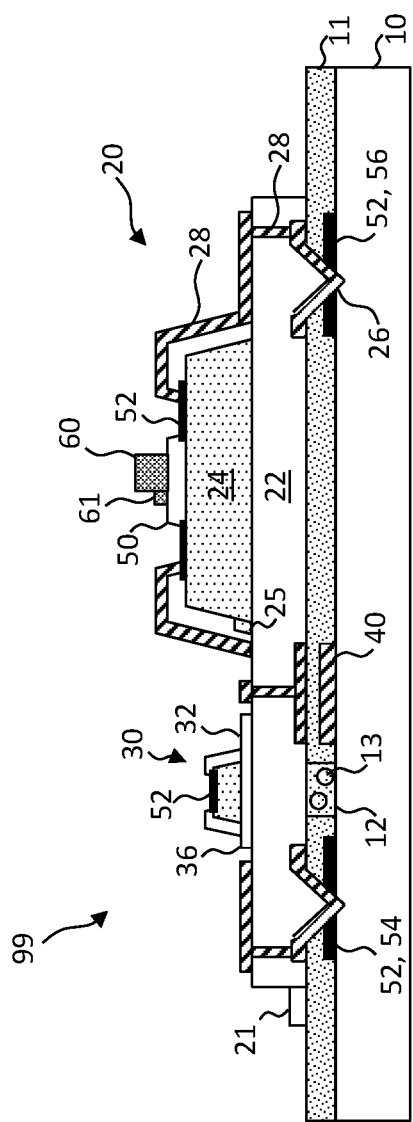
FIG. 4 is a schematic cross section of a pixel disposed on a system substrate according to illustrative embodiments of the present disclosure.

According to some embodiments of the present disclosure and as shown in FIGS. 2A and 2B, pixels 20 can comprise a pixel substrate 22 non-native to (e.g., separate and independent from) system substrate 10. Pixel substrate 22 can be disposed upon system substrate 10 (e.g., a non-native target substrate), for example by micro-transfer printing. Pixel substrate 22 can be adhered to system substrate 10, for example with a layer of adhesive 11 (e.g., as shown in FIG. 4). Electrical connections between pixel circuit 24 on pixel substrate 22 (e.g., pixel wires 28 or electrodes) can be formed using photolithographic methods and materials, e.g., patterned metal traces. According to some embodiments, and as shown in FIGS. 2A, 2B, 3A, and 3B, pixel 20 comprises electrically conductive connection posts 26 that protrude from pixel substrate 22 and are electrically connected to pixel circuit 24. Connection posts 26 can protrude from an opposite side of pixel substrate 22 than pixel circuit 24 and can be electrically connected to pixel circuit 24 through pixel wires 28 that pass through pixel substrate 22 (e.g., a through silicon via or TSV). As illustrated in FIG. 4, when pixel 20 is transfer printed from a pixel source wafer to system substrate 10, connection posts 26 can be aligned with and pressed into and/or pierce corresponding electrical contact pads 52 on system substrate 10 to form an electrical connection between pixel circuit 24 and system substrate 10, for example row wires 14 (if not capacitively coupled), power 54, or ground 56. By curing a layer of adhesive 11 between pixel substrate 22 and system substrate, connection posts 26 can be firmly affixed to and drawn into close contact with corresponding electrical contact pads 52 on system substrate 10. Connection posts 26 can provide power 54 and ground 56 connections to pixel 20 as well as signal connections, for example row electrical signals (if not capacitively coupled). When transfer printed, pixel substrate 22 can comprise a fractured or separated tether 31.

As shown in FIGS. 3A and 3B, pixel 20 can be a micro-transfer printable or printed pixel 20 comprising a pixel substrate 22 on which a pixel circuit 24 is mounted or formed. Pixel circuit 24 can be insulated with a patterned dielectric structure 50 and electrically connected through exposed electrical contact pads 52 by pixel wires 28 that extend over dielectric structure 50, pixel substrate 22, and through pixel substrate 22. (For clarity of illustration, FIGS. 3A and 3B illustrate only some pixel wires 28 and do not define a complete electrical circuit.) Inorganic light-emitting diodes (iLEDs) 60 (for example a red iLED emitting red light when provided with electrical power, a green iLED emitting green light when provided with electrical power, and a blue iLED emitting blue light when provided with electrical power) can be disposed on pixel circuit 24 (e.g., as shown in FIG. 3B), or disposed on pixel substrate 22 (not shown). iLEDs 60 can be controlled through signals, for example from pixel circuit 24 through pixel wires 28. Pixel 20 can also comprise a sensor 30, for example a photosensor 30, electrically connected to and controlled by pixel circuit 24. Photosensor 30 can be disposed on pixel substrate 22 (as shown) or on pixel circuit 24. Pixel 20 can also comprise a capacitor plate 40 useful for capacitively coupling signals, for example transmitted to or from pixel circuit 24 through pixel wires 28. Elements (e.g., iLEDs 60, photosensor 30, and capacitor plate 40) controlled by pixel circuit 24 can supply control signals to and respond to signals from the element. Pixel wires 28 illustrated in FIGS. 3A and 3B can comprise multiple, electrically independent wires or electrodes, e.g., in an electrical bus. iLED 60 can comprise a compound semiconductor material and pixel circuit 24 can comprise silicon (e.g., monocrystalline silicon) so that pixel 20 is a heterogeneous integrated device comprising different materials assembled into a common structure or system.

Each iLED 60 can comprise an iLED substrate non-native to (e.g., separate and independent from) system substrate 10 and pixel substrate 22, can be micro-transfer printed onto pixel circuit 24 or pixel substrate 22, and can comprise a fractured iLED tether 61 as a consequence of micro-transfer printing iLED 60. Photosensor 30 can comprise a photosensor substrate 36 non-native to (e.g., separate and independent from) system substrate 10 (shown in FIG. 4), pixel substrate 22, any iLED substrate, can be micro-transfer printed onto pixel circuit 24 or pixel substrate 22, and can comprise a fractured photosensor tether 32 as a consequence of micro-transfer printing photosensor 30. Similarly, pixel circuit 24 can comprise a pixel circuit substrate non-native to (e.g., separate and independent from) system substrate 10, pixel substrate 22, any iLED substrate, and photosensor substrate 36, can be micro-transfer printed onto pixel substrate 22, and can comprise a fractured or separated pixel circuit tether 25. Pixel 20, comprising pixel substrate 22, pixel circuit 24, iLEDs 60, and photosensor 30 can also be micro-transfer printed as a unit and can comprise a pixel tether 21.

According to embodiments of the present disclosure, a capacitively coupled signal is communicated from a capacitor plate 40 on system substrate 10 to a capacitor plate 40 on a pixel 20, for example on a top side or a bottom side of a pixel substrate. Capacitor plate 40 on the system substrate 10 can be vertically aligned with capacitor plate 40 on pixel substrate 10. In some embodiments, the two capacitor plates 40 can be separated by a layer of adhesive 11, for example less than 10 microns thick (e.g., less than 5 microns thick, less than two microns thick, or less than one micron thick) or by approximately (e.g., within 10% of) the length of a connection post 26. In some embodiments, the two capacitor plates 40 can be additionally separated by pixel substrate 22. In both cases the two capacitor plates 40 are on separate substrates (e.g., system substrate 10 and pixel substrate 22). Since pixel 20 can be an unpackaged structure, capacitor plates 40 can be disposed directly on pixel substrate 22 and therefore can be more closely aligned with and near to and have shorter pixel wire 28 connections to pixel circuit 24.

Pixel circuit 24 can comprise a substrate (e.g., a silicon substrate) non-native to (e.g., separate and independent from) pixel substrate 22 on or in which circuit elements can be formed, including photosensor 30. In some embodiments, photosensor 30 comprises a structure separate and independent of, but electrically connected to, pixel circuit 24.

Connection posts 26 can extend from pixel substrate 22, for example on a bottom side of pixel substrate 22 opposite pixel circuit 24 and photosensor 30 disposed on a top side of pixel substrate 22 and can be electrically connected to pixel circuit 24 through pixel wires 28 to provide electrical connections to row electrical signals and column optical signals. Pixel circuit 24 can be disposed on, in, or over pixel substrate 22 and can be responsive to or provide control signals to row wires 14 and column light-pipes 12.

Figure 6B:
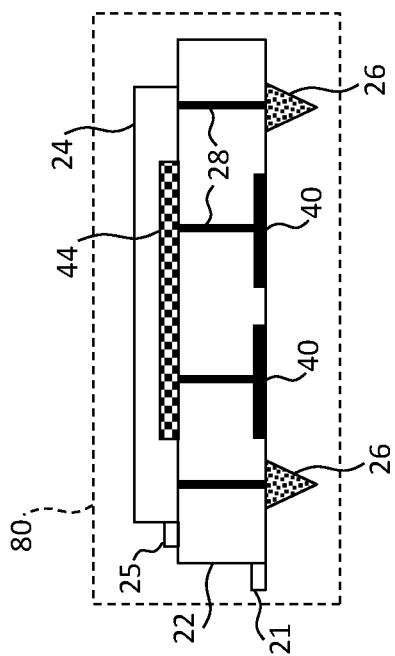
FIG. 6B is an illustrative cross section of the pixel of FIG. 6A, and FIGS. 6C and 6D are partial schematic plan views of the system substrate of FIG. 6A according to illustrative embodiments of the present disclosure.
Figure 6A:
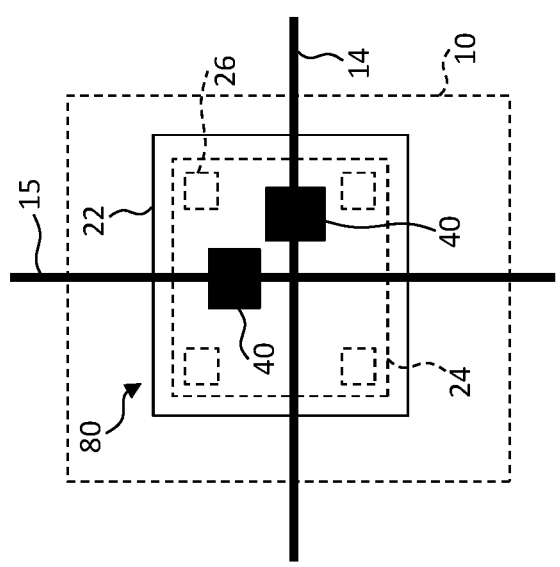
FIG. 6A is a schematic plan view of a pixel disposed on a system substrate.
Figure 6C:
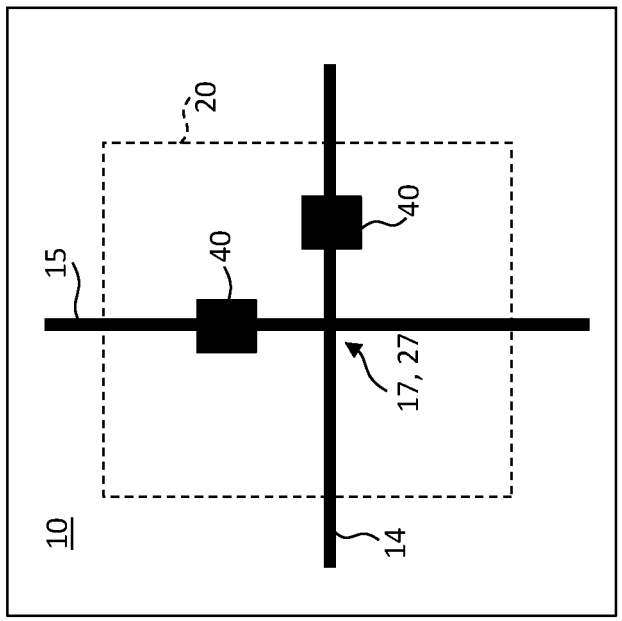
Figure 6D:
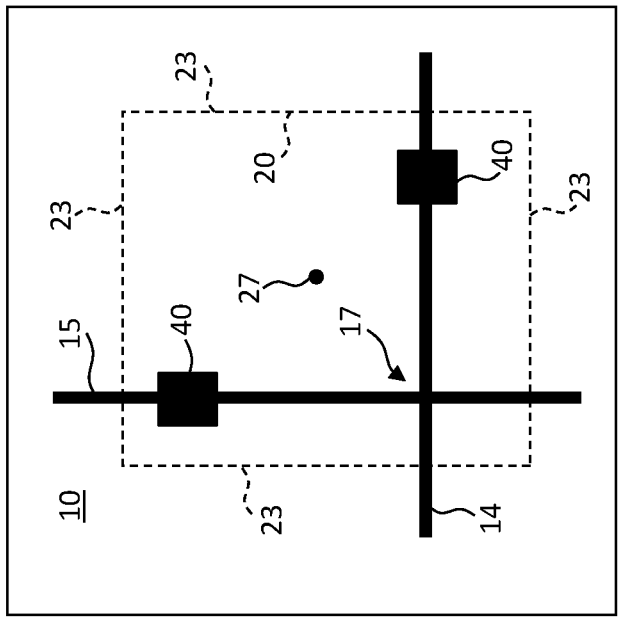
Figure 7:
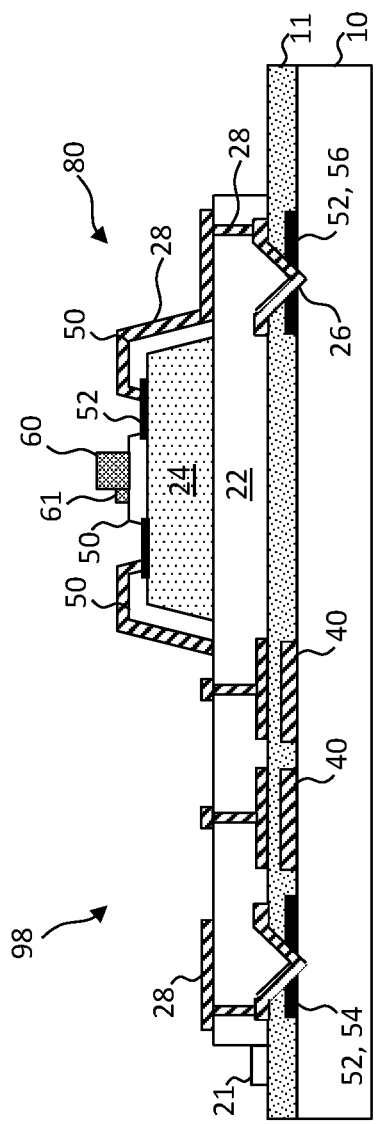
FIG. 7 is a schematic cross section of a pixel disposed on a system substrate according to illustrative embodiments of the present disclosure.

In some embodiments of the present disclosure, and with reference to FIGS. 5-7, a capacitively coupled active-matrix system 98 comprises a system substrate 10, row wires 14 extending in a row direction R over system substrate 10, a row controller 16 providing a row electrical signal to each row wire 14 disposed on system substrate 10, column wires 15 extending in a column direction C over system substrate 10, a column controller 18 providing a column electrical signal to each column wire 15 disposed on system substrate 10, and capacitively coupled pixels 80 disposed over system substrate 10. Each capacitively coupled pixel 80 comprises a pixel circuit 24 that is uniquely responsive to a row wire 14 and to a column wire 15, pixel circuit 24 receiving a row electrical signal from row wire 14 and receiving a column electrical signal from column wire 15. Pixel circuit 24 is capacitively coupled to row wire 14 and is capacitively coupled to column wire 15, for example through capacitor plates 40.

In some embodiments, row controller 16 can provide row electrical signals on row wires 14 to control pixels 20 and column controller 18 can provide column electrical signals on column wires 15. The row and column electrical signals are received by pixel 20, for example by pixel circuit 24. In some embodiments, row electrical signals are row-select signals that select a row of pixels 20 and column electrical signals are column-data signals that provide data to a column of pixels 20. Pixel circuit 24 can comprise an electrical input circuit 44 responsive to the row and column electrical signals on row wires 14 and column wires 15, respectively, used by pixel circuit 24 to perform the function of pixel circuit 24.

According to some embodiments of the present disclosure, and as illustrated in FIGS. 6A-6C, electrical input circuit 44 of pixel 20 is capacitively coupled to row wire 14 and capacitively coupled to column wire 15 corresponding to pixel 20. In some embodiments, some electrical connections are between pixel 20 and system substrate 10 are provided by direct electrical connection (e.g., through connection posts 26) and other electrical connections are provided through a capacitive connection using capacitor plates 40. A capacitively coupled interface does not require a physical electrical signal connected between two electrical elements but rather relies on an electrical field provided on one capacitor plate 40 and sensed by another capacitor plate 40 (electrical sensor pad), in this case a capacitor plate 40 disposed on or over system substrate 10 and another capacitor plate 40 disposed on either the top or bottom (as shown in FIG. 6B) of pixel substrate 22. In some embodiments in which pixel 20 is provided on a pixel substrate 22 separate and independent of system substrate 10, such capacitive coupling can reduce the number of electrical connections required between pixel substrate 22 and system substrate 10 (e.g., connection posts 26). In some embodiments, manufacturing yields or costs can be improved by reducing the number of connection posts 26.

Capacitor plates 40 can comprise a portion of row wire 14 or column wire 15, or both, or can be a conductive area on system substrate 10 (or pixel substrate 22) electrically connected to row wire 14 or column wire 15 that has a larger extent over system substrate 10 than row wire 14 or column wire 15, as shown in FIG. 6C. A greater extent can increase the capacitive coupling area and improve signal response to row electrical signals in electrical input circuit 44. As shown in FIG. 6D, the signal-to-noise ratio of capacitively coupled signals on row line 14 and column line 15 can be further improved by laterally separating capacitor plate 40 for row line 14 from capacitor plate 40 for column line 15 so that their electrical fields do not interact and signals do not electrically interfere. According to some embodiments of the present disclosure, row wire 14 and column wire 15 cross (without being electrically connected) at a cross-over location 17, pixel 20 has pixel edges 23 (sides or portions of a perimeter of pixel 20, for example of pixel substrate 22), and a pixel center 27 (e.g., a centroid of pixel 20, for example of pixel substrate 22). Electrical input circuit 44 of pixel 20 is capacitively coupled to row wire 14 closer to pixel edge 23 than to pixel center 27 or to cross-over location 17, for example with capacitor plate 40. Similarly, in some embodiments, electrical input circuit 44 of pixel 20 is capacitively coupled to column wire 15 closer to pixel edge 23 than to pixel center 27 or to cross-over location 17, for example with capacitor plate 40. In some embodiments, cross-over location 17 is closer to a pixel edge 23 (or pixel corner) than to pixel center 27 so that capacitive coupling with row wire 14 can be separated at a greater distance from capacitive coupling with column wire 15.

According to some embodiments, and as shown in FIG. 7, pixel 20 comprises electrically conductive connection posts 26 that protrude from pixel substrate 22 and are electrically connected to pixel circuit 24. Connection posts 26 can protrude from an opposite side of pixel substrate 22 than pixel circuit 24 and can be electrically connected to pixel circuit 24 through pixel wires 28 that pass through pixel substrate 22 (e.g., a through-silicon via (TSV)). As illustrated in FIG. 7, when pixel 20 is transfer printed from a pixel source wafer to system substrate 10, connection posts 26 can be aligned with and pressed into and/or pierce corresponding electrical contact pads 52 on system substrate 10 to form an electrical connection between pixel circuit 24 and system substrate 10, for example row wires 14 (if not capacitively coupled), power 54, or ground 56. By curing a layer of adhesive 11 between pixel substrate 22 and system substrate 10, connection posts 26 are firmly affixed to and drawn into close contact with corresponding electrical contact pads on system substrate 10. Connection posts 26 can provide power 54 and ground 56 connections to pixel 20 as well as signal connections, for example row or column electrical signals (if not capacitively coupled). As illustrated in FIGS. 5-7, row wires 14 and column wires 15 are capacitively coupled through capacitor plates 40 to pixel wires 28 and pixel circuit 24. When transfer printed, pixel substrate 22 can comprise a fractured or separated photosensor tether 32. (For clarity, FIG. 7 does not illustrate all of pixel wires 28 or electrical connections in pixel 20 connected to pixel circuit 24, but rather an illustrative subset.)

According to embodiments of the present disclosure, and as illustrated in FIGS. 2B, 3A, 4, 6B, and 7, a capacitor plate 40 for capacitive coupling a signal from system substrate 10 is disposed on a bottom side of pixel substrate 22 opposite pixel circuit 24. If capacitor plate 40 is disposed on the bottom side of pixel substrate 22, it can be separated only by a layer of adhesive 11, which can be only a few microns thick, for example less than 10 microns thick (e.g., less than 5 microns thick, less than two microns thick, or less than one micron thick) or by the length of a connection post 26, enabling good capacitive coupling between the capacitor plates 40. In some embodiments, capacitor plate 40 can be disposed on the same top side of pixel substrate 22 as pixel circuit 24 (not shown) so that the two capacitor plates 40 can be additionally separated by pixel substrate 22. If capacitor plates 40 come into contact, the electrical input circuit 44 can still operate.

Figure 8:
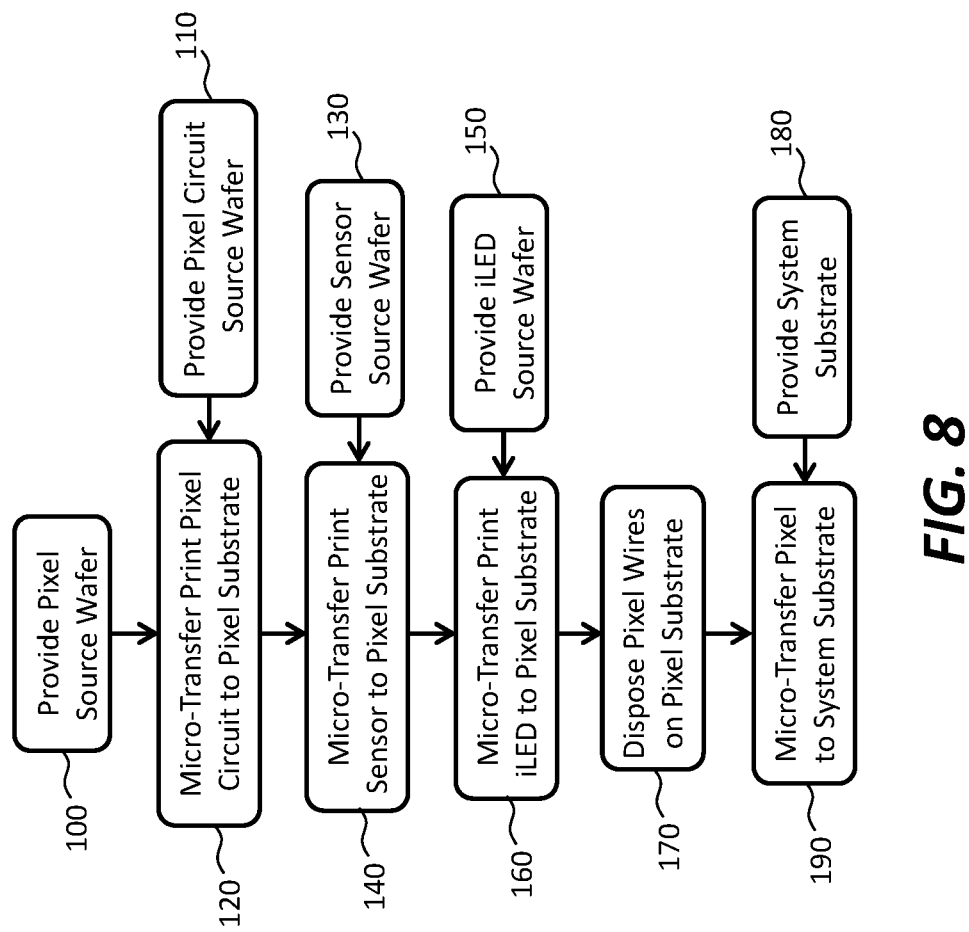
FIG. 8 is a flow diagram according to illustrative embodiments of the present disclosure.

As shown in the flow diagram of FIG. 8, embodiments of the present disclosure can be constructed by providing a pixel source wafer in step 100. The pixel source wafer can comprise an array of pixel substrates 22 that can be released for micro-transfer printing. In some embodiments, pixel circuit 24 can be formed in or on pixel substrate 22, for example if pixel substrate 22 comprises a semiconductor such as silicon. In some embodiments, a pixel source wafer comprising micro-transfer printable pixel circuits 24 is provided in step 110 and pixel circuits 24 are micro-transfer printed to pixel substrate 22 in step 120. If optical column data communication is desired, a sensor source wafer comprising micro-transfer printable photosensors 30 (and, optionally, photosensor circuits) can be provided in step 130 and photosensors 30 are micro-transfer printed to pixel substrate 22 (or onto pixel circuit 24) in step 140. One or more iLED source wafers comprising micro-transfer printable iLEDs 60 (for example emitting different colors of light) is provided in step 150 and iLEDs 60 are micro-transfer printed to pixel substrate 22 (or onto pixel circuit 24) in step 160. In step 170, pixel wires 28 are disposed on or over pixel substrate 22 to electrically connect pixel circuit 24, photosensors 30, and iLEDs 60, for example by evaporating metal onto pixel substrate 22 and patterning the metal using photolithographic methods and materials, to complete pixel 20. Optionally, an encapsulating layer is provided over pixel 20. Pixel 20 can be micro-transfer printed to a system substrate 10 (provided in step 180 together with any system substrate 10 wires such as row wires 14, column wires 15, or column light-pipes 12, and contact pads 52) in step 190. If pixel 20 is provided with connection posts 26, the connection posts 26 can be embedded into and in electrical contact with contact pads 52 on system substrate 10. Connection post 26 construction and micro-transfer printing are described in U.S. Pat. No. 10,468,363, whose contents are incorporated herein by reference.

According to embodiments of the present disclosure, a controller (not shown) of an electro-optically controlled active-matrix system 99 can operate pixels 20 by providing control signals to row controller 16 and column controller 18. In response, row controller 16 provides row electrical signals on row wires 14 that are sensed by electrical input circuit 44 (for example directly through pixel wires 28, connection posts 26, or capacitively through capacitor plates 40) and column controller 18 provides column electrical signals that are converted by column light emitters 19 into optical data signals transmitted into column light-pipes 12 that are sensed by optical input circuit 34 in pixel 20. Optical input circuit 34 and electrical input circuit 44 then provide electrical control signals to pixel circuit 24 that operate pixel 20, for example by providing controlled current to iLEDs 60. Row controller 16 can sequentially energize row wires 14 to select corresponding rows with row-select signals and column controller 18 can provide column-data signals to each column simultaneously, so that each row of pixels 20 receives column data at the same time and sequential rows of pixels 20 sequentially receive column data. In some embodiments comprising column wires 15 (e.g., as shown in FIGS. 5-7), electrical input circuit 44 can respond to both row electrical signals and column electrical signals.

In embodiments of the present disclosure, system substrate 10 can comprise multiple layers, for example layers of dielectric material in or between each of which is a patterned layer of metal, for example metal conductors, in a wire layer. In some embodiments, column light-pipes 12 can be disposed in a dielectric material layer in which or between which a patterned metal layer is disposed. In some embodiments, column light-pipes 12 can be disposed in a dielectric material layer different from a layer in which a patterned metal layer is disposed, for example in a light-pipe layer. In some embodiments, column light-pipes 12 can be disposed in, on, or over a top layer of system substrate 10.

According to embodiments of the present disclosure, pixel circuits 24, light sensors 30, or iLEDs 60 can be formed or disposed in or on source wafers constructed using, for example, one or more of integrated circuit, micro-electro-mechanical, and photolithographic methods. Pixel 20 can be assembled on a pixel source wafer, for example a glass, polymer, or semiconductor (e.g., silicon) source wafer. Pixel circuits 24, light sensors 30, iLEDs 60, or pixels 20 (referred to collectively and individually as components) can comprise one or more different component materials, for example, non-crystalline or crystalline semiconductor materials such as silicon or compound semiconductor materials. Any of the source wafers can comprise a sacrificial layer comprising laterally separated sacrificial portions over which any of the components are completely disposed and can be connected by tethers (e.g., iLED tethers 61, pixel circuit tethers 25, photosensor tethers 32, or pixel tethers 21) to anchor portions separating the sacrificial portions. The components can be micro-transfer printed from their respective source wafers to a target substrate (e.g., pixel substrate 22 or system substrate 10) using a stamp (e.g., an elastomeric stamp).

Any of the components can be micro-devices having at least one of a length and a width no more than 200 microns (e.g., no more than 100 microns, no more than 50 microns, no more than 25 microns, no more than 15 microns, no more than 10 microns, or no more than five microns), and, optionally, a thickness of no more than 50 microns (e.g., no more than 25 microns, no more than 15 microns, no more than 10 microns, no more than five microns, no more than two microns, or no more than one micron). In some embodiments, any of the components can be unpackaged dice (each an unpackaged die) transferred directly from native source wafers on or in which they are constructed to corresponding target substrates (e.g., pixel substrate 22 or system substrate 10) without wafer dicing.

System substrate 10 or pixel substrates 22 can be any destination substrate or target substrate to which one or more components are transferred (e.g., micro-transfer printed), for example flat-panel display or imaging substrates, printed circuit boards, or similar substrates. In certain embodiments, system substrate 10 or pixel substrate 22 can have multiple layers and can be or comprise a member selected from the group consisting of polymer, plastic, resin, polyimide, PEN, PET, metal, metal foil, glass, a semiconductor (e.g., silicon), a compound semiconductor, quartz, ceramics, and sapphire. In certain embodiments, system substrate 10 or pixel substrate 22 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

In some embodiments of the present disclosure, a layer of adhesive 11, such as a layer of resin, polymer, or epoxy, either curable or non-curable, adheres any one or more of the components onto a corresponding target substrate (e.g., pixel substrate 22 or system substrate 10) and can be disposed, for example by coating or lamination. In some embodiments, the layer of adhesive 11 is disposed in a pattern, for example using inkjet, screening, or photolithographic techniques. In some embodiments, a layer of adhesive 11 is coated, for example with a spray or slot coater, and then patterned, for example using photolithographic techniques.

Patterned electrical conductors (e.g., wires, traces, or electrical contact pads such as those found on printed circuit boards, flat-panel display substrates, and in thin-film circuits) can be formed on any one or combination of one or more pixel substrate 22 and system substrate 10. One or more electrical contact pads 52 can be in or on system substrate 10 and/or in or on one or more of the components to electrically connect them. Such patterned electrical conductors (e.g., pixel wires 28) and contact pads 52 can comprise, for example metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on system substrate 10.

Micro-transfer printing processes suitable for disposing any one or more of the components onto pixel substrates 22 or system substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety.

For a discussion of micro-transfer printing techniques, see also U.S. Pat. Nos. 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby also incorporated by reference in its entirety. Accordingly, in some embodiments, printed electro-optically controlled active-matrix system 99 or capacitively coupled active-matrix system 98 is a compound micro-assembled structure (e.g., a macro-system).

According to various embodiments of the present disclosure, source wafers can be provided with components, patterned sacrificial portions, tethers (e.g., iLED tethers 61, pixel circuit tethers 25, photosensor tethers 32, or pixel tethers 21), and anchors already formed, or they can be constructed as part of a method. Components, stamps, pixel substrates 22, and system substrate 10 can be made separately and at different times or in different temporal orders or locations and provided in various process states.

Any one or more of the components, in certain embodiments, can be constructed using foundry fabrication processes used in the art. Layers of materials can be used, including materials such as metals, oxides, nitrides and other materials used in the integrated-circuit art. Components can have a different sizes, for example, each having an area of 100 square microns or larger, 1000 square microns or larger or 10,000 square microns or larger, 100,000 square microns or larger, or 1 square mm or larger, can have variable aspect ratios, for example between 1:1 and 10:1 (e.g., 1:1, 2:1, 5:1, or 10:1), and can be rectangular or can have other shapes.

Various embodiments of structures and methods are described herein. Structures and methods were variously described as transferring components, printing components, or micro-transfer printing components as examples and the particular word used should be understood to be non-limiting as to the methods that may be used to implement the described embodiments. In some embodiments, micro-transfer-printing includes using a stamp (e.g., an elastomeric stamp such as a PDMS stamp) to transfer a component using controlled adhesion. For example, an exemplary stamp can use kinetic or shear-assisted control of adhesion between the stamp and a component. It is contemplated that, in certain embodiments, where a method is described as including printing (e.g., micro-transfer-printing) a component, other analogous embodiments exist using a different transfer method. As used herein, transferring a component (e.g., from a component source wafer or wafer to a target substrate) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a stamp is a vacuum tool or other transfer device used to transfer components. In some embodiments, a stamp uses one or more of electrostatic forces, magnetic forces, and vacuum forces to transfer components (e.g., applied to individual components by individual stamp posts).

As is understood by those skilled in the art, the terms "over" and "under" are relative terms and can be interchanged in reference to different orientations of the layers, elements, and substrates included in the present disclosure. Furthermore, a first layer "on" a second layer is a relative orientation of the first layer to the second layer that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., an in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the disclosure.

PARTS LIST

R row direction
C column direction
10 system substrate
11 adhesive
12 column light-pipe
13 optical structure
14 row wire
15 column wire
16 row controller
17 cross-over location
19 column controller
19 column light emitter
20 pixel
21 pixel tether
22 pixel substrate
23 pixel edge
24 pixel circuit
25 pixel circuit tether
26 connection post
27 pixel center
28 pixel wire/bus
30 light sensor/photosensor
32 photosensor tether
34 optical input circuit
36 photosensor substrate
40 capacitor plate
44 electrical input circuit
50 dielectric structure
52 contact pad
54 power
56 ground
60 inorganic light-emitting diodes (iLEDs)
61 iLED tether
70 bus
80 capacitively coupled pixel
98 capacitively coupled active-matrix system
99 electro-optically controlled active-matrix system
100 provide pixel source wafer step
110 provide pixel circuit source wafer step
120 micro-transfer print pixel circuit to pixel substrate step
130 provide sensor source wafer step
140 micro-transfer print sensor to pixel substrate step
150 provide iLED source wafer step
160 micro-transfer iLED to pixel substrate step
170 dispose pixel wires on pixel substrate step
180 provide system substrate step
190 micro-transfer print pixel to system substrate step

What is claimed:

1. An electro-optically controlled active-matrix system, comprising:
a system substrate;
row wires extending in a row direction disposed on or in the system substrate operable to transmit row electrical signals;
a row controller operable to provide a respective row electrical signal to each of the row wires;
column light-pipes comprising a substantially transparent material extending in a column direction disposed on the system substrate operable to transmit column optical signals;
a column controller operable to provide a respective column optical signal by emitting light into each of the column light-pipes; and
pixels disposed over the system substrate, wherein each of the pixels comprises an inorganic light-emitting diode and a pixel circuit that comprises an electrical input circuit uniquely responsive to one of the row wires transmitting a respective row electrical signal and an optical input circuit comprising a photosensor, photodiode, or phototransistor responsive to respective column optical signals transmitted through one of the column light-pipes, the pixel circuit operable to receive the respective row electrical signal from the one of the row wires and to receive the respective column optical signal from the one of the column light-pipes and the inorganic light-emitting diode operable to emit light in response to the respective row electrical signal and the respective column optical signal.

2. The electro-optically controlled active-matrix system of claim 1, wherein the electro-optically controlled active-matrix system is a display system or an imaging system.

3. The electro-optically controlled active-matrix system of claim 1, wherein the pixels are arranged in a matrix-addressed array over the system substrate.

4. The electro-optically controlled active-matrix system of claim 1, wherein the row wires are substantially orthogonal to the column light-pipes.

5. The electro-optically controlled active-matrix system of claim 1, wherein the column controller comprises an inorganic light-emitting diode that emits light into each of the column light-pipes.

6. The electro-optically controlled active-matrix system of claim 1, wherein the electrical input circuit of the pixel circuit is capacitively coupled to the one of the row wires corresponding to the pixel circuit.

7. The electro-optically controlled active-matrix system of claim 1, wherein each of the pixels comprises a photosensor.

8. The electro-optically controlled active-matrix system of claim 1, wherein each of the pixels comprises a pixel substrate non-native to the system substrate.

9. The electro-optically controlled active-matrix system of claim 8, wherein the pixel substrate comprises a fractured or separated tether.

\* \* \* \* \*